United States Patent [19]

Ignasiak et al.

[11] Patent Number: 4,846,702
[45] Date of Patent: Jul. 11, 1989

[54] ELECTRICAL CONNECTOR FOR SURFACE MOUNT CHIP CARRIER INSTALLED IN A SOCKET

[75] Inventors: Martin C. Ignasiak, Mentor, Ohio; Horst E. Moll, Weil im Shonbuch, Fed. Rep. of Germany

[73] Assignee: Minnesota Mining & Manufacturing Company, St. Paul, Minn.

[21] Appl. No.: 141,597

[22] Filed: Jan. 7, 1988

[51] Int. Cl.$^4$ .............................................. H01R 9/09
[52] U.S. Cl. ..................................... 439/71; 439/72; 439/912
[58] Field of Search ............................ 439/54, 71–73, 439/76, 912

[56] References Cited

U.S. PATENT DOCUMENTS

| | | | |
|---|---|---|---|
| 3,656,183 | 4/1972 | Walterscheid | 439/511 |
| 3,728,667 | 4/1973 | Richelmann | 439/912 |
| 4,089,575 | 5/1978 | Grabbe | 439/71 |
| 4,679,871 | 7/1987 | Egawa | 439/72 |
| 4,729,739 | 3/1988 | Coffee et al. | 439/71 |
| 4,747,784 | 5/1988 | Cedrone | 439/71 |
| 4,786,256 | 11/1988 | Angeleri et al. | 439/72 |

Primary Examiner—P. Austin Bradley
Attorney, Agent, or Firm—Renner, Otto, Boisselle & Sklar

[57] ABSTRACT

A connector for making self-retaining, disconnectable electrical contacts to each of the leads of a surface mount leaded chip carrier disposed in a socket includes a plurality of contact members arranged geometrically similarly to the carrier leads. Each contact member includes a coupling portion for establishing a connection to an external device, a mounting portion mounted in a non-electrically conducting body and a blade-like contacting portion for insertion between a carrier lead and a socket contact finger resiliently bearing on the carrier lead. The non-conducting body slidably engages an insulating anvil that bears on the carrier to hold it in position in the socket when the contacting portion blades are withdrawn from between the carrier leads and socket contact fingers. A collar extending from the anvil includes a hole closely surrounding each blade to guard against excessive bending of the blades.

37 Claims, 2 Drawing Sheets

U.S. Patent  Jul. 11, 1989  Sheet 1 of 2  4,846,702
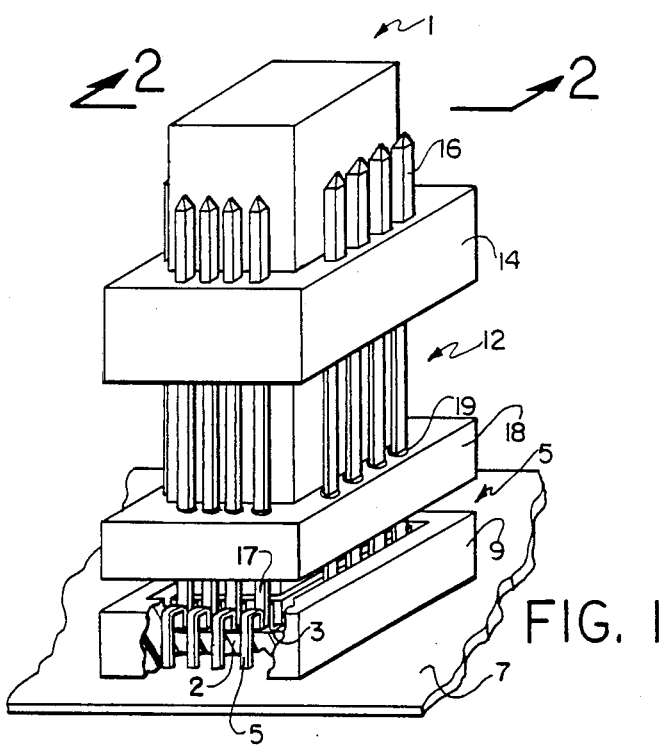
FIG. 1
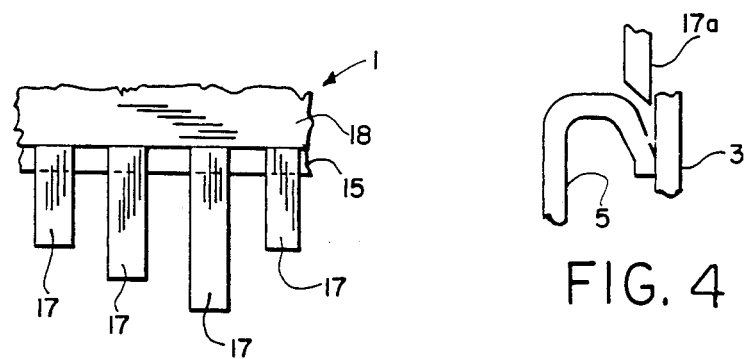
FIG. 3
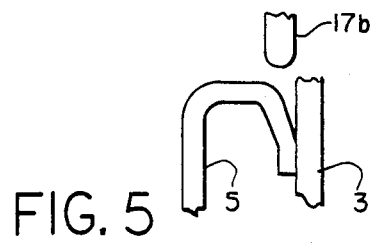
FIG. 4
FIG. 5

ELECTRICAL CONNECTOR FOR SURFACE MOUNT CHIP CARRIER INSTALLED IN A SOCKET

BACKGROUND

This invention concerns connectors for making electrical connections, particularly temporarily, to an electrical device, and, more particularly, to test clip type connectors for making connections to peripherally extending leads of surface mount chip carriers that are installed in sockets mounted on a printed circuit board.

Many test clips and connectors for making electrical connections to leads extending from an integrated circuit package are known. An example of a test clip for an integrated circuit of the dual-in-line (DIP) package type, is disclosed in U.S. Pat. No. Re. 28,064. DIP packages may have from 14 to 64 leads arranged in a pair of parallel rows on the two generally relatively longer parallel sides of the DIP package. Typically the leads are spaced on 0.100 inch (2.5 mm.) centers. The DIP package may be installed by inserting the leads into a DIP socket that has been soldered to a printed circuit board. DIP packages are oridinarily spaced from each other and from other components on a printed circuit board by distances of at least several tenths of an inch. The reissue patent test clip may be used to make electrical connections with each of the leads of a DIP package for signal testing and signal injecting purposes while the integrated circuit package is in its usual mounting or when it is unmounted.

More recently, integrated circuit packages have been developed that permit denser packing of integrated circuits on printed circuit boards. These packages also have a greater number of leads since they are used with more complex integrated circuits. These types of packages are referred to as LCC's for leaded chip carriers. LCC's typically can accommodate one or more circuit chips that are mounted on a lead frame. The lead frame connections are electrically and mechanically connected to the LCC leads. The LCC is completed by encasing the chip or chips with an electrically non-conductive encapsulating medium. Exemplary encapsulating media include plastic or plastic-like material or ceramic material. In the case that plastic material is used, the designation PLCC, for plastic leaded chip carrier, is sometimes used. As compared to DIP's, LCC's can be far more densely packed on a printed circuit board. This improvement is attributable at least in part to location of leads along all sides of an LCC and narrowed spacing between leads in an LCC. LCC's can be mounted close to each other on a printed circuit board, for example, 0.035 inch (0.88 mm.) apart.

State-of-the-art LCC's are generally square or rectangular and may have a large number of leads, e.g., 132 leads, 33 leads per side, extending from a square package. Other packages may have a total of 20 or more leads. In a typical 20 lead LCC, the leads are positioned on 0.050 inch (1.27 mm.) centers along each side. Obviously as the density of packing increases, the size of leads decreases. Various arrangements of leads for surface mounting LCC packages have been devised. Some LCC packages use leads that are bent in semicircles to extend under the LCC package. These packages may be positioned on a printed circuit board with the leads touching prepared solder lands. The solder is melted long enough to establish mechanical and electrical connection between the respective LCC leads and lands. Alternatively, the LCC may be inserted into a socket that is soldered to a printed circuit board. The socket includes a separate contact for establishing an electrical connection from each of the LCC leads to a soldered connection on the printed circuit board.

It is desirable to have a test probe to make temporary electrical connections with each of the leads of an LC or DIP mounted in a socket for signal sensing or signal injection. Preferably, the test probe leads make a connection to each of the leads of an LCC or DIP that is electrically and mechanically stable, self-retaining and can be disconnected when desired without disturbing the socketed LCC or DIP. The close spacing of the LCC and DIP leads means that the test probe contacts must be small and that they are therefore delicate. A test connector should protect these delicate probe leads against bending or other damage and should control the probe leads' positions to avoid short circuiting between the LCC or DIP leads being probed.

Accordingly, it would be desirable to provide a connector for contacting an LCC or DIP mounted in a socket and disposed on a densely packed printed circuit board. It would be particularly desirable to provide such a connector that can make a separate, self-retaining, disconnectable electrical and mechanical contact to the LCC or DIP leads that can be disconnected without disturbing the socketed LCC or DIP.

SUMMARY OF THE INVENTION

In accordance with the invention, a connector is provided for establishing electrical communication between an external device and the leads of an electrical component, such as a surface mount LCC or DIP, that is disposed in a socket mounted on a printed circuit board. The socket contains a plurality of contact elements, one of which resiliently bears on each of the lead elements of the LCC or DIP to make an electrical connection. The opposite end of the socket leads make electrical connections to solder lands on a printed circuit board or the like.

The novel connector includes a plurality of electrical contact members for establishing electrical and mechanical contacts to the LCC or DIP lead elements and the socket contact elements. Each contact member includes a flexible, blade-like contacting portion that may be inserted between a lead element and a socket contact element resiliently bearing on the lead element. The resiliency of the lead element-socket element contact permits insertion of the blade between those elements and makes the inserted blade contact self-retaining. By withdrawing the blade-like contacting portion from between the lead element and the socket contact element the test connector can be disconnected. The blade contacts can be inserted and withdrawn without interrupting the lead element-socket element connections.

The contact members of the novel connector include a mounting portion that is secured to an electrically non-conductive body. Preferably, the contact members are mounted with the body in a geometrical arrangement so that one of the contacting portions can be placed in registration with each of the lead elements extending from the LCC or DIP package. Each contact member further includes a coupling portion, preferably extending from the body in a direction opposite from the contacting portion, for electrically connecting each contact member to other external apparatus, such as an electrical signal detector, electrical signal source or other signal monitoring or injection apparatus.

The non-conductive body slidably engages an anvil that may be placed in mechanical contact with the LCC or DIP package to retain it in the socket. In use, the anvil is placed on the LCC or DIP package. Then the body that slidably engages the anvil and in which the contact members are mounted, is moved toward the LCC or DIP package. The contacting portion blades are urged forward by the body so that they are inserted between the engaged chip carrier lead elements and the socket contact elements. In order to disconnect the novel connector, the anvil is also urged toward the chip carrier package to hold the package in position in the socket as the blade-like contacting portions are withdrawn from between the lead elements and socket contact elements.

The blade-like contacting portions are of relatively small size, are therefore delicate and must be maintained in a proper location in order to register with the lead elements of a chip carrier repeatedly. To protect these contacting portions, a guide or guard fixed to the anvil extends peripherally from the anvil and contains a separate hole for each of the contacting portions blades. The holes are shaped and positioned to fit snugly around each contacting portion to guard against undesired bending of the blades.

The foregoing and other objects, features and advantages will become more apparent from the following description with reference to the drawings.

To the accomplishment of the foregoing and related ends the invention, then, comprises the features hereinafter fully described and particularly pointed out in the claims., the following description and the annexed drawings setting forth in detail certain illustrative embodiments of the invention, these being indicative, however, of but a few of the various ways in which the principles of the invention may be employed.

BRIEF DESCRIPTION OF THE DRAWINGS

In the annexed drawings:

FIG. 1 is a pictorial view of a connector according to the invention in place on a socketed chip carrier with the socket partially broken away;

FIG. 3 is an enlarged fragmentary front elevation view of a modified connector with staggered length contacts;

FIG. 4 is an enlarged fragmentary edge schematic view of a modified contacting portion having a pointed tip shown in relation to an LCC lead and a socket contact element; and FIG. 5 is an enlarged fragmentary edge schematic view of another modified contacting portion having a pointed tip shown in relation to an LCC lead and a socket contact element.

DETAILED DESCRIPTION OF THE PREFERRED EMBODIMENTS

Figure 2:
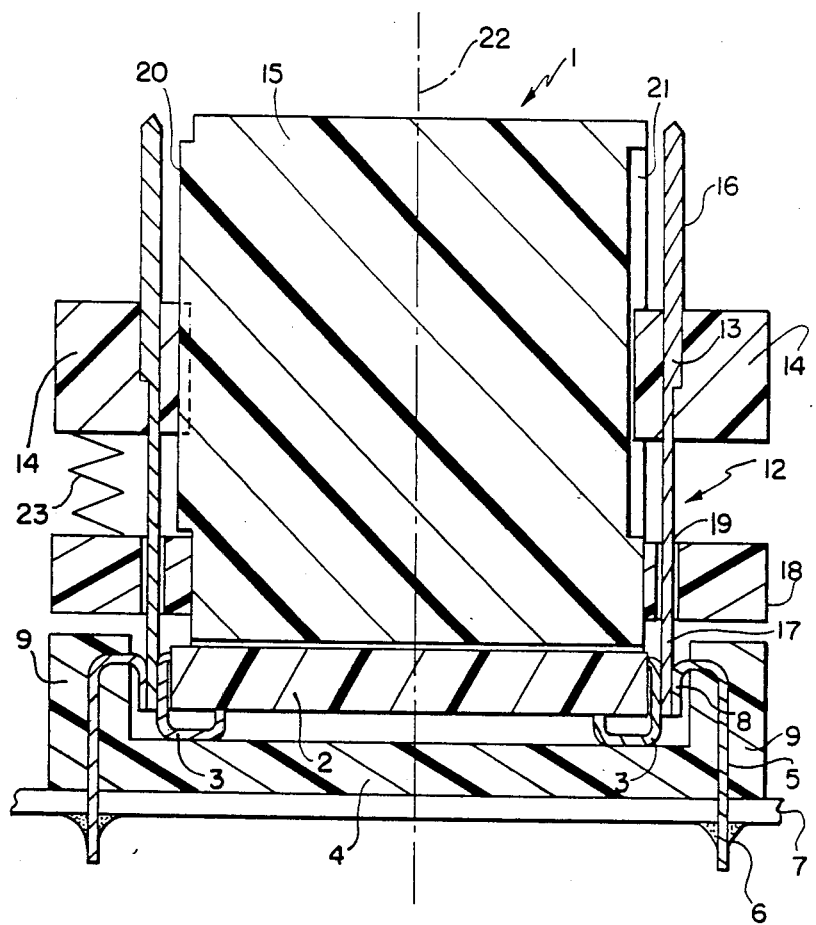
FIG. 2 is a sectional view of the connector of FIG. 1 in place on a socketed chip carrier taken along lines 2—2 of FIG. 1.

In FIG. 1 a perspective view of a connector 1 according to the invenion is shown. A sectional view of the connector is shown in FIG. 2. In both figures like elements are given the same reference numerals. The drawings are not to any scale and certain dimensions have been exaggerated in order to illustrate the features of the invention. Except as noted, both figures are described simultaneously.

In both of the figures, connector 1 is shown installed on a leaded chip carrier (LCC) 2 so that electrical signals may be injected into the LCC through its leads or electrical signals at those leads can be detected, tested and/or othrewise used. While reference is made in the following description to an LCC, clearly any chip carrier, such as a dual-in-like package (DIP) that is mountable in a socket, can be used with the invention. Also, although the preferred embodiment of connector 1 has a four sided rectangular shape, it will be appreciated that the various features of the invention may be embodied in a connector with less than four, e.g., two or three, or more than four sides with provisions for making electrical connections at all or fewer than all such sides.

LCC 2 includes along its outside surfaces a plurality of leads 3 that are disposed along the side surfaces and bent underneath the body of LCC 2. These leads are referred to as surface mount leads. In surface mounting, the leads of an LCC are disposed on individual, prepared solder lands on a printed circuit board. The solder is briefly melted and then solidified establishing mechanical and electrical contacts between the solder lands and the LCC lead elements. However, LCC's can also be mounted in appropriately prepared sockets, such as socket 4.

Socket 4 includes a number of socket contact elements 5. A socket contact element 5 is provided for each of the lands on an LCC or DIP that is intended to be installed in the socket. Each socket contact element 5 includes a soldering portion 6 protruding through the bottom wall of socket 4. The soldering protions are inserted in prepared holes in a printed circuit board 7 and solder joints are formed with each of portions 6 by wave soldering, reflowing pre-existing solder lands or another technique. The solder joints thus formed mechanically attach socket 4 to printed circuit board 7 and establish electrical connections between socket contact elements 5 and other circuitry.

Opposite soldering portions 6 of socket contacts 5, a resilient contacting finger 8 of contact 5 protrudes into the inside volume of socket 4. When LCC 2 is installed in the socket, it leads 3 contact fingers 8 urging them apart and toward the upstanding walls 9 of the socket. The pressure exerted by fingers 8 holds LCC 2 in place mechanically and ensures a good electrical contact between each lead 3 and its respective contact finger 8. An obvious advantage of using socket 4 rather than directly surface mounting LCC 2 on board 7 is the ability to remove the LCC and replace it with another without melting any solder.

Connector 1 provides a means of establishing temporary electrical contacts to each of leads 3 of LCC 2. The electrical contacts established with connector 1 are self-retaining in that once the contacts are made they hold themselves in place mechanically without continuous application of any external force. When desired, connector 1 can be disengaged without dislodging LCC 2 from its position within socket 4.

Connector 1 includes a number of electrical contact members 12 geometrically arranged so that one of members 12 can be placed in contact with each of leads 3 of LCC 2. Contact members 12 include central mounting portions 13 that are secured in the desired geometric arrangement in an electrically non-conductive body 14, e.g., by frictional or biting engagement relation of the mounting portions 13 in openings in the body or by molding the body 14 directly to the mounting portions. Body 14 generally includes a central opening and is peripherally disposed about a second body or anvil 15. Preferably, body 14 slidably engages anvil 15 so that body 14 can be controllably raised or lowered with respect to LCC 2 when the bottom surface of anvil 15 engages LCC 2. Since contact members 12 are securely mounted in body 14, they are raised and lowered along with the motion of body 14.

Each of contacting members 12 includes at one of its ends a coupling portion 16 for establishing an electrical connection to an external body. As shown, these coupling portions are relatively large and may have a cross section, transverse to the length of members 12, that is rectangular. For example, coupling portion 16 may be a square post 0.025 inch (0.64 mm) on a side. Electrical communication from each of coupling portions 16 to an external apparatus may be made by wrapping wire around coupling portion 16, by fitting another connector over coupling portion 16 or other means. Coupling portions 16 are sufficiently robust to support reasonable forces exerted by an attached wire or connector without permanent bending or other damage.

At the end of contact member 12 opposite from coupling portion 16 is a blade-like contacting portion 17. As most clearly shown in FIG. 2, a contacting portion 17 of a contact member is inserted between a lead 3 of LCC 2 and the socket contact finger 8 resiliently bearing on contact 3. Each contact member 12 includes a transition from the rectangular post or other relatively large cross section pin of coupling portion 16 to the blade-like contacting portion 17. Preferably, that cross sectional transition takes place within coupling portion 16. Preferably, body 14 is a molded plastic material formed around contact members 12 so that it grips and supports those contacting members and in doing so surrounds the cross sectional transition.

Because contacting portions 17 are of a relatively small cross section, they are subject to bending both during insertion between an LCC lead and socket contact finger and when not in use. A collar 18 extending from anvil 15 provides support to and guides each of members 12. Collar 18 includes a hole 19 for each of the contacting portions 17 of contact members 12. While in FIG. 2 the size of the hole in relation to the size of contacting portion 17 appears large for clarity, the clearance between contacting portion 17 and hole 19 is preferably small. That clearance is large enough to allow contacting portion 17 to move freely through hole 19, but sufficiently small so that significant bending of contacting portion 17 is resisted by collar 18. Collar 18 thereby both supports and guides contacting portion 17. Collar 18 may be a separate electrically insulating body that is attached to body 15 with an adhesive or other material. However, it is preferred that collar 18 and anvil 15 be unitary. For example, anvil 15 and collar 18 may be a single piece of a molded plastic.

In order that body 14 can slidably engage anvil 15 in a controllable way, a means for directing the sliding is provided. In FIG. 2, two slide control structures are shown. On the left side of the figure, a tongue 20 protrudes from the side of anvil 15 and is generally parallel to contact member 12. Body 14 includes a groove complementary to tongue 20, the hidden groove surface being indicated by the broken lines. On the right side of FIG. 2, a sliding control structure includes a groove 21 in the side of anvil 15 disposed generally parallel to contact member 12. In this embodiment, body 14 includes a complementary tongue engaging groove 21. These different sliding control embodiments may be disposed as shown, one of each of opposite sides of the connector. Or, one or the other of the embodiments could be employed on only one or on two sides of a connector according to the invention.

As is particularly apparent from the description of the sliding control means, anvil 15 includes a central axis 22 and body 14 also includes a central axis that is substantially coincident with axis 22. The sliding of body 14 on anvil 15 takes place generally along axis 22.

In order to establish electrical connections to the leads of an LCC or DIP with connector 1, anvil 15 is placed on top of the LCC or DIP. Contacting portions 17 of contact members 12 are aligned with leads 3 of an LCC. Body 14 is then urged in the direction of LCC 2 so that contacting portions 17 are inserted between socket contact fingers 8 and leads 3 by deflecting fingers 8. Electrical contact between the leads and fingers is not lost during insertion of contacting portions 17 since those portions are electrically conducting. Once contacting portions 17 are seated between leads 2 and fingers 8, the pressure exerted by fingers 8 against portions 17 and leads 3 is sufficient to retain the contacting portions. That is, once connector 2 is properly seated, external forces may be removed from it and the connector will remain in place. In order to remove connector 1, anvil 15 is first urged toward LCC 2 to ensure that its positioning within socket 4 is not disturbed. Once that force has been applied, body 14 may be pulled away from LCC 2. While these opposing forces are being applied, contacting portions 17 are withdrawn from their positions between leads 3 and socket contact fingers 8. As with the insertion step, electrical contact between leads 2 and their appropriate socket contact fingers is not lost during the withdrawal process. Once contacting portions 17 have been extracted from between leads 3 and fingers 8, the force applied to anvil 15 may be released and the connector mechanically removed from the vicinity of LCC 2.

In order to aid the insertion and withdrawal process, a biasing means, such as a coil spring 23, or another type of spring, may be installed between body 14 and collar 18.

FIG. 2 is obviously schematic in nature showing the general construction of a preferred embodiment of a connector according to the invention. FIG. 1 is shown as having only four contact members 12 on each of its four sides. The number of contact members is limited in FIG. 1 for clarity. Obviously, many more contacts could be disposed on each side of the connector. In addition, connector 1 is shown in FIG. 2 for use with a generally rectangular or square LCC. For use with a DIP, an embodiment of the novel connector would include two rows of contact members 12 disposed on opposite sides of the connector. Likewise, for a different shape LCC or DIP package, including, for example, a circular package, the contact members would be arranged in a different configuration. When a large number of contact members 12 are employed, some or all of them may include offsetting bends along their lengths to spread their coupling portions 16 apart for making wire wrap or other connections to each of the coupling portions without mutual interference.

Briefly referring to FIG. 3, it will be seen that in the modified connector 1 there the contacting portions are of staggered length. Therefore, during insertion of contacting portions 17 between respective pairs of LCC leads 3 and socket contact elements 5, fewer than all of such contacting portions will begin initial insertion at one time. For example, only one third or one fourth of the contacting portions 17 will initially make such engagement; subsequently the next third or fourth will make such engagement and so forth. Accordingly, the amount of insertion force required to insert the contacting elements between the leads 3 and elements 5 at any one time effectively is reduced to one third or one fourth, etc. of that required in the case that all of such contacting portions would be inserted at one time. By reducing such insertion force, it is possible to increase accuracy of installation and to minimize damage to the various parts involved in the connector 1 and those leads and elements to which it is being connected. Although this feature has been employed in the past in various types of cable connector systems, it is believed novel and particularly effective in the instant invention where generally unlike parts are being connected and especially because the contacting elements are relatively thin and, thus, fragile in order to fit in the small space between leads and elements without breaking or over-stressing any of the parts.

Referring to FIGS. 4 and 5, it will be seen that the tips of the contacting portions 17a and 17b may be pointed or curved, respectively. Such configuration facilitates aligning and inserting the contacting portions between respective pairs of LCC leads 3 and contact elements 5 without damaging same. Such configuration also facilitates pushing an open space between respective pairs of leads and elements. Although various shapes for tips of contacts have been used in the past, the shapes described here are particularly advantageous to achieve positioning, deforming, inserting, etc. in the small spaces provided while using relatively fragile components.

The invention has been described with respect to certain preferred embodiments. Various modifications and additions within the spirit of the invention will occur to those of skill in the art. Accordingly, the scope of the invention is limited solely by the following claims.

We claim:

1. A connector for making electrical connections to an electrical device, such as a leaded chip carrier, mounted in a socket comprising:
   a generally polygonal arrangement of electrical contact members including a plurality of said contact members disposed at each side of said polygonal arrangement for making self-retaining, disconnectable electrical connections between (i) conductive lead elements of said device having a generally polygonal carrier body and a plurality of conductive lead elements extending from at least three sides of said carrier body and in contact with contact elements of a socket for said device and (ii) other apparatus;
   electrically non-conductive body means, having an axis, for supporting said contact members, each of said contact members including a mounting portion secured to said body means, a coupling portion for electrically connecting said member to other apparatus, and a flexible contacting portion protruding from said body means generally parallel to said axis, for electrically and mechanically contacting one of said conductive lead elements; and
   anvil means for engaging the body of said device to urge said device toward said socket, said anvil means slidably engaging said body means.

2. The connector of claim 1 wherein said anvil means engages said body means slidably alaong said axis.

3. The connector of claim 1 wherein said body means has a generally rectangular cross-section transverse to said axis and said coupling portions protrude from said body means generally parallel to said axis at each side of said rectangular body means.

4. The connector of claim 1 wherein said at least one of said contacting portions comprises a blade for insertion between a said lead element and a said socket contact element resiliently bearing on said lead element.

5. The connector of claim 1 wherein said body means is disposed coaxially with and peripheral to said anvil means.

6. The connector of claim 1 including means disposed on said body means and anvil means for controlling sliding of said body means on said anvil means.

7. The connector of claim 6 wherein said means for controlling sliding comprises a groove disposed on one of said body means and said anvil means and a tongue complementary to said groove disposed on the other of said body means and said anvil means.

8. The connector of claim 1 including guard means extending from said anvil means for guarding at least one of said contacting portions against excessive bending.

9. The connector of claim 8 wherein said guard means comprises an electrically non-conductive collar extending from said anvil means and including at least one hole generally parallel to said axis surrounding said at least one contacting portion.

10. The connector of claim 9 wherein said collar is fixedly attached to said anvil means.

11. The connector of claim 9 wherein said collar is unitary with said anvil.

12. The connector of claim 9 including biasing means disposed between said body means and said guide means for urging said body means and said guide means apart along said axis.

13. The connector of claim 12 wherein said biasing means comprises a spring disposed between said body means and said guide means.

14. A connector for making electrical connections to a leaded chip carrier mounted in a socket comprising:
   a plurality of electrical contact members, each member including a contacting portion for making a self-retaining, disconnectable mechanical and electrical contact to at least one conductive lead element of a chip carrier mounted in a socket and having a carrier body and a plurality of conductive lead elements extending from the perimeter of the carrier body, said at least one lead element contacting a contact element of a chip carrier socket, said contact members being arranged so that a plurality of said lead elements may be simultaneously contacted by said contacting portions of respective contact members;
   first electrically non-conductive body means, having a first axis, for supporting said contact members, each of said contact members including a mounting portion secured to said first body means, a coupling portion for electrically connecting said member to other apparatus, and said contacting portion, said contacting portion being flexible and protruding from said first body means generally parallel to said first axis; and second body means, having a second axis substantially coincident with said first axis, said second body means engaging said first body means slidably along said first axis for contacting said carrier body to urge said chip carrier toward said socket.

15. The connector of claim 14 wherein at least one of said contacting portions comprises a blade for insertion between a said lead element and a said socket contact element resiliently bearing on said lead element.

16. The connector of claim 14 wherein said first body means is disposed coaxially with and peripheral to said second body means.

17. The connector of claim 14 including biasing means disposed between said first and second body means for urging said first and second body means apart in a direction along said first axis.

18. The connector of claim 17 wherein said biasing means comprises a spring disposed between said first and second body means.

19. The connector of claim 14 including means disposed on said first and second body means for controlling sliding of said first body means with respect to said second body means.

20. The connector of claim 19 wherein said means for controlling sliding comprises a groove disposed on one of said first and second body means and a tongue complementary to said groove disposed on the other of said first and second body means for slidably engaging said groove.

21. The connector of claim 14 including guard means extending from said first body means for guarding said at least one of said contacting portions against excessive bending.

22. The connector of claim 21 wherein said guard means comprises an electrically non-conductive collar extending from said first body means and including at least one hole generally parallel to said first axis surrounding said at least one contacting portion.

23. The connector of claim 22 wherein said collar is fixedly attached to said first body means.

24. The connector of claim 22 wherein said collar is unitary with said first body means.

25. A connector for making electrical connections to a leaded chip carrier mounted in a socket comprising:

a plurality of electrical contact members, each contact member including a flexible, blade-like contacting portion for insertion between and in mechanical and electrical contact with (i) a lead element extending from a chip carrier and (ii) a chip carrier socket contact element resiliently contacting said lead element;

first electrically non-conductive body means, having an axis, for supporting said contact members, each of said contact members including a mounting portion secured to said first body means, a coupling portion for electrically connecting said member to other apparatus, and said contacting portion, at least one of said contacting portions protruding from said first body means generally parallel to said first axis; and second body means slidably engaging said first body means along said first axis for contacting said carrier body to urge said chip carrier toward said socket.

26. The connector of claim 25 wherein said first body means is disposed coaxially with and peripheral to said second body means.

27. The connector of claim 25 wherein a plurality of said contacting portions are of different respective lengths.

28. The connector of claim 25 wherein the leading tips of respective contacting portions are pointed.

29. The connector of claim 25 wherein the leading tips of respective contacting portions are curved.

30. The connector of claim 25 including biasing means disposed between said first and second body means for urging said first and second body means apart in a direction along said axis.

31. The connector of claim 30 wherein said biasing means comprises a spring disposed between said first and second body means.

32. The connector of claim 25 including means disposed on said first and second body means for controlling sliding of said first body means with respect to said second body means.

33. The connector of claim 32 wherein said means for controlling sliding comprises a groove disposed on one of said first and second body means and a tongue complementary to said groove disposed on the other of said first and second body means for slidably engaging said groove.

34. The connector of claim 25 including guard means extending from said second body means for guarding at least one of said contacting portions against excessive bending.

35. The connector of claim 34 wherein said guard means comprises an electrically non-conductive collar extending from said second body means and including at least one hole generally parallel to said axis surrounding said at least one contacting portion.

36. The connector of claim 35 wherein said collar is fixedly attached to said second body means.

37. The connector of claim 35, wherein said collar is unitary with said second body means.

* * * * *